(12) United States Patent
Wu

(10) Patent No.: US 12,412,790 B2
(45) Date of Patent: Sep. 9, 2025

(54) SEMICONDUCTOR STRUCTURE, MEMORY, AND CRACK TESTING METHOD

(71) Applicant: CHANGXIN MEMORY TECHNOLOGIES, INC., Hefei (CN)

(72) Inventor: Shuangshuang Wu, Hefei (CN)

(73) Assignee: CHANGXIN MEMORY TECHNOLOGIES, INC., Hefei (TW)

( * ) Notice: Subject to any disclaimer, the term of this patent is extended or adjusted under 35 U.S.C. 154(b) by 691 days.

(21) Appl. No.: 17/810,588

(22) Filed: Jul. 1, 2022

(65) Prior Publication Data

US 2023/0077851 A1 Mar. 16, 2023

Related U.S. Application Data

(63) Continuation of application No. PCT/CN2022/077073, filed on Feb. 21, 2022.

(30) Foreign Application Priority Data

Sep. 14, 2021 (CN) .......................... 202111084056.6

(51) Int. Cl.
  *G01R 31/08* (2020.01)
  *G01R 31/26* (2020.01)
  *H01L 21/66* (2006.01)
  *H01L 23/48* (2006.01)
(52) U.S. Cl.
  CPC .......... *H01L 22/32* (2013.01); *G01R 31/2601* (2013.01); *H01L 23/481* (2013.01)

(58) Field of Classification Search
  CPC ............ G01R 31/2601; G01R 31/2858; G01R 31/2884; H01L 22/14; H01L 22/32; H01L 23/481
  See application file for complete search history.

(56) References Cited

U.S. PATENT DOCUMENTS

| 8,227,840 | B2 | 7/2012 | Wang |
| 8,227,902 | B2 | 7/2012 | Kuo |
| 8,232,648 | B2 | 7/2012 | McGahay |
| 8,648,341 | B2 | 2/2014 | Yang |
| 8,890,293 | B2 * | 11/2014 | Lu .......................... H01L 21/76 257/490 |
| 9,466,562 | B2 | 10/2016 | Nakazawa |
| 9,568,543 | B2 | 2/2017 | Wang |

(Continued)

FOREIGN PATENT DOCUMENTS

| CN | 101447479 A | 6/2009 |
| CN | 102479761 A | 5/2012 |

(Continued)

*Primary Examiner* — Thang X Le
(74) *Attorney, Agent, or Firm* — SYNCODA LLC; Feng Ma

(57) ABSTRACT

A semiconductor structure includes: a through silicon via penetrating a base; and a protection structure, including: a conductive first test ring and a conductive second test ring both arranged around the through silicon via and electrically insulated from the through silicon via; a first dielectric layer located between the first test ring and the second test ring and configured to electrically isolate the first test ring from the second test ring; and a first connection layer located in the first dielectric layer and configured to be electrically connected to the first test ring and the second test ring.

14 Claims, 7 Drawing Sheets

(56) References Cited

U.S. PATENT DOCUMENTS

| | | |
|---|---|---|
| 2009/0134500 A1 | 5/2009 | Kuo |
| 2010/0164062 A1 | 7/2010 | Wang |
| 2011/0291279 A1 | 12/2011 | McGahay |
| 2011/0291287 A1* | 12/2011 | Wu .................. H01L 21/76898 |
| | | 257/E21.597 |
| 2012/0126412 A1 | 5/2012 | Wang |
| 2013/0009663 A1 | 1/2013 | Gauch |
| 2013/0161827 A1 | 6/2013 | Nakazawa et al. |
| 2013/0221353 A1 | 8/2013 | Yang |
| 2014/0191410 A1 | 7/2014 | Leatherman |
| 2015/0115993 A1 | 4/2015 | Wang et al. |
| 2016/0258996 A1 | 9/2016 | Lim et al. |
| 2020/0294869 A1 | 9/2020 | Jeong et al. |
| 2021/0088576 A1 | 3/2021 | Lin et al. |
| 2022/0254739 A1* | 8/2022 | Ku ....................... H01L 23/564 |
| 2022/0301981 A1* | 9/2022 | Chang .................. H01L 23/585 |

FOREIGN PATENT DOCUMENTS

| | | |
|---|---|---|
| CN | 102867812 A | 1/2013 |
| CN | 103094252 A | 5/2013 |
| CN | 105845597 A | 8/2016 |
| CN | 108140615 A | 6/2018 |
| CN | 111081579 A | 4/2020 |

\* cited by examiner

SEMICONDUCTOR STRUCTURE, MEMORY, AND CRACK TESTING METHOD

CROSS-REFERENCE TO RELATED APPLICATIONS

This is a continuation of International Patent Application No. PCT/CN2022/077073, filed on Feb. 21, 2022, which claims priority to Chinese Patent Application No. 202111084056.6, filed on Sep. 14, 2021. The disclosures of the above-referenced applications are hereby incorporated by reference in their entirety.

BACKGROUND

With the development of semiconductor technology, the feature dimension of an integrated circuit continues to reduce, and the interconnection density of the devices continues to increase. Conventional two-dimensional packaging can no longer meet the requirements of the industry. Therefore, a vertical interconnect stack packaging method based on the Through Silicon Via (TSV) technology gradually becomes the development trend of packaging technologies due to its key technical advantages of short-distance interconnection and high-density integration.

SUMMARY

The disclosure relates to the technical field of semiconductors, in particular relates to, but is not limited to, a semiconductor structure, a memory, and a crack testing method.

In view of this, embodiments of the disclosure provide a semiconductor structure, a memory, and a crack testing method.

According to a first aspect of the embodiments of the disclosure, a semiconductor structure is provided, which includes:
  a through silicon via penetrating a base; and
  a protection structure, including:
  a conductive first test ring and a conductive second test ring both arranged around the through silicon via and electrically insulated from the through silicon via;
  a first dielectric layer located between the first test ring and the second test ring and configured to electrically isolate the first test ring from the second test ring; and
  a first connection layer located in the first dielectric layer and configured to be electrically connected to the first test ring and the second test ring.

According to a second aspect of the embodiments of the disclosure, a memory is provided, which includes:
  at least one semiconductor structure, in which the semiconductor structure includes a through silicon via penetrating through a base, and a protection structure, and in which the protection structure includes: a conductive first test ring and a conductive second test ring both arranged around the through silicon via and electrically insulated from the through silicon via; a first dielectric layer located between the first test ring and the second test ring and configured to electrically isolate the first test ring from the second test ring; and a first connection layer located in the first dielectric layer and configured to be electrically connected to the first test ring and the second test ring, and the base includes a substrate and an insulating layer covering the substrate; and
  a storage element arranged in the insulating layer.

According to a third aspect of the embodiments of the disclosure, a crack testing method for testing a semiconductor structure is provided. The semiconductor structure includes a through silicon via penetrating through a base, and a protection structure. The protection structure includes: a conductive first test ring and a conductive second test ring both arranged around the through silicon via and electrically insulated from the through silicon via; a first dielectric layer located between the first test ring and the second test ring and configured to electrically isolate the first test ring from the second test ring; and a first connection layer located in the first dielectric layer and configured to be electrically connected to the first test ring and the second test ring. The crack testing method includes the following operations.

The semiconductor structure is provided.

A first electrical signal is provided to a first contact at an end of the first test ring and a second contact at an end of the second test ring, so as to determine a first electrical parameter of a first path arranged in the protection structure and electrically connected to the first contact and the second contact.

In a case that the first electrical parameter satisfies a first preset condition, it is determined that no crack appears in the through silicon via.

In a case that the first electrical parameter does not satisfy a first preset condition, it is determined that cracks appear in the through silicon via.

BRIEF DESCRIPTION OF THE DRAWINGS

In the accompanying drawings (which are not necessarily drawn to scale), similar reference numerals may denote similar components in different diagrams. The similar reference numerals having different letter suffixes may denote different examples of the similar components. The accompanying drawings generally illustrate various embodiments discussed in the disclosure by way of example and not by way of limitation.

DETAILED DESCRIPTION

Figure 1A:
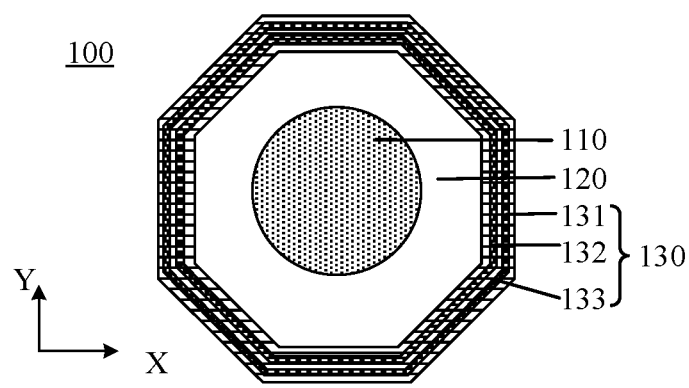
FIG. 1A is a top view of a semiconductor structure according to some embodiments.

The technical solutions of the disclosure are further described below in detail with reference to the accompanying drawings and the embodiments. Although the exemplary embodiments of the disclosure are shown in the accompanying drawings, it should be understood that the disclosure may be implemented in various forms, and cannot be limited by the embodiments illustrated herein. On the contrary, these embodiments are provided to more thoroughly understand the disclosure and to completely convey the scope of the disclosure to those skilled in the art.

The disclosure is described more specifically by way of example in the following paragraphs with reference to the accompanying drawings. The advantages and features of the disclosure will become apparent in light of the following description and claims. It should be noted that the accompanying drawings are provided in a very simplified form not necessarily drawn to exact scale, and are only intended to facilitate convenience and clarify in explaining the embodiments of the disclosure.

It may be understood that the meaning of "on . . . ", "over . . . ", and "above . . . " in this disclosure should be read in the broadest manner, so that "on . . . " not only means that it is "on" something without any intervening features or layers therebetween (i.e., directly on something), but also includes the meaning of being "on" something with intervening features or layers therebetween.

In the embodiments of the disclosure, the term "A is connected to B" encompasses the case where A is connected to B in a manner that A and B are in contact with each other, or where A is connected to B in a manner that A is not in contact with B with other components interposed between A and B.

In the embodiments of the disclosure, the terms "first" and "second" are only used to distinguish similar objects, but do not necessarily indicate a specific order or sequence.

In the embodiments of the disclosure, the term "layer" refers to a portion of material that includes an area having a thickness. The layer may extend over the entirety of the structure below or above the layer, or may have an extent smaller than the extent of the structure below or above the layer. In addition, the layer may be an area of homogeneous or inhomogeneous continuous structure having a thickness less than the thickness of the continuous structure. For example, the layer may be located between the top and bottom surfaces of the continuous structure, or the layer may be arranged between any pairs of the horizontal faces at the top and bottom surfaces of the continuous structure. The layer may extend horizontally, vertically, and/or along an inclined surface. The layer may include a plurality of sub-layers. For example, the interconnection layer may include one or more conductor and contact sublayers (in which interconnection wires and/or through hole contacts are formed), and one or more dielectric sublayers.

It should be noted that the technical solutions recited in the embodiments of the disclosure can be arbitrarily combined with each other without conflict.

A TSV penetrates through the entire wafer. Therefore, the TSV may affect structures arranged on the wafer near the TSV, which may degrade the performance of a formed device. Moreover, currently, there is no method to effectively test the influence of the TSV on the structures near the TSV In some implementations, in order to realize the three-dimensional stacking of chips, a TSV penetrating through a substrate may be provided to realize the electrical connection between an upper chip and a lower chip. Usually, the TSV is filled with conductive metal, such as copper or tungsten. However, the stress and electric field generated by the TSV may adversely affect the performance of the device disposed around the TSV, especially when the dimension of the TSV is relatively large.

For example, if the TSV is filled with copper, when the temperature of the silicon substrate changes, due to the mismatch between the thermal expansion coefficients of the silicon substrate and copper, it is easy to cause the TSV to generate tensile stress or compressive stress on the surrounding silicon substrate. The magnitude of the tensile stress or compressive stress is inversely proportional to the distance from the TSV. The tensile stress or compressive stress will change the lattice constant of at least part of the structure of a device (e.g., the channel area of the MOS transistor) arranged around the TSV, thereby changing the mobility of carries, which adversely affects the electrical performance of the device.

Moreover, when cracks are formed in the insulating material around the TSV due to the stress, the conductive material included in the TSV may diffuse through the cracks, or even the TSV may diffuse through the cracks to be electrically connected to the surrounding device, which results in a short circuit in the memory and reduces the quality and reliability of the memory.

Figure 1B:
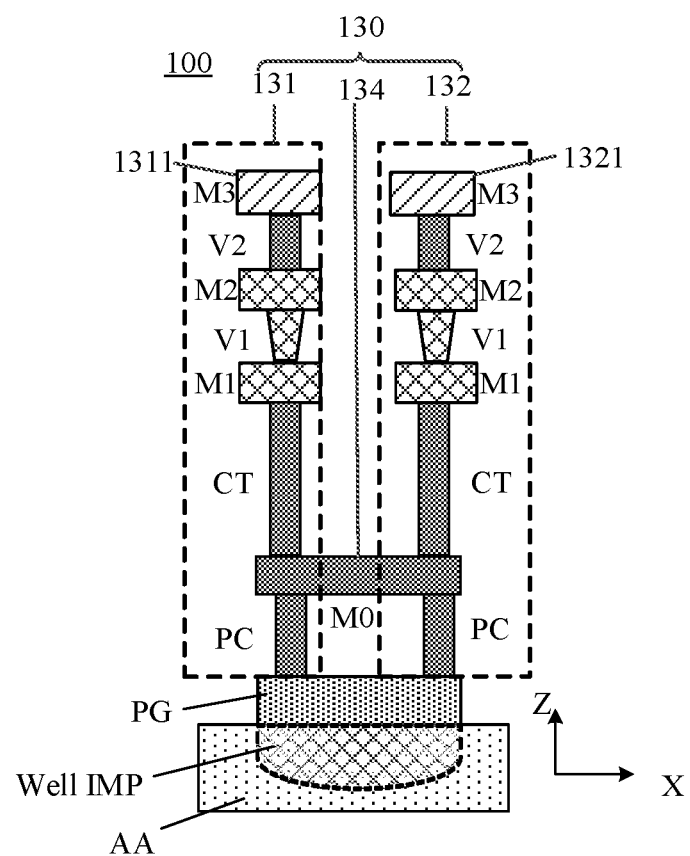
FIG. 1B is a partial schematic cross-sectional view of a semiconductor structure according to some embodiments.

In view of this, embodiments of the disclosure provide a semiconductor structure 100. With reference to FIG. 1A and FIG. 1B, the semiconductor structure 100 includes:
  a through silicon via (TSV) 110 penetrating through a base 120; and
  a protection structure 130, which includes:
    a conductive first test ring 131 and a conductive second test ring 132 both arranged around the TSV 110 and electrically insulated from the TSV 110;
    a first dielectric layer 133 located between the first test ring 131 and the second test ring 132 and configured to electrically isolate the first test ring 131 from the second test ring 132; and
    a first connection layer 134 located in the first dielectric layer 133 and configured to be electrically connected to the first test ring 131 and the second test ring 132.

Exemplary, the TSV 110 may penetrate through the base 120 in a first direction. With reference to FIG. 1B, the first direction may include a direction parallel to the Z axis. The material of the TSV 110 may include a conductive material, such as copper or tungsten.

In some embodiments, the material of the TSV 110 further includes a barrier layer, which is arranged between the conductive material and the base 120, and is configured to prevent the conductive material from diffusing to the base 120. The material of the barrier layer may include a metal nitride, such as titanium nitride and/or tantalum nitride. The material of the barrier layer may also include an oxide, such as silicon oxide and/or silicon oxynitride.

The material of the base 120 may include a semiconductor substrate. The material of the semiconductor substrate may include silicon, Silicon on Insulator (SOI), or Stacked Silicon on Insulator (SSOI). As shown in FIG. 1B, an Active Area (AA) may be defined on the semiconductor substrate.

The material of the base 120 may also include a dielectric material, such as silicon dioxide or tetraethyl orthosilicate (TEOS).

The material of the first test ring 131 may be the same as the material of the second test ring 132. For example, the materials of the first test ring 131 and the second test ring 132 may include copper or tungsten.

With reference to FIG. 1B, an end of the first test ring 131 may include a first contact 1311, which is configured to receive an electrical signal applied to the first test ring 131.

An end of the second test ring 132 may include a second contact 1321, which is configured to receive an electrical signal applied to the second test ring 132.

With reference to FIG. 1A, the second test ring 132 may be arranged between the first test ring 131 and the TSV 110. It needs to be emphasized that there is a gap between the second test ring 132 and the TSV 110. The gap is filled with a dielectric material, so as to electrically isolate the second test ring 132 from the TSV 110.

With reference to FIG. 1A and FIG. 1B, in the semiconductor structure 100, when cracks are formed between the TSV 110 and the protection structure 130 due to stress or other reasons, the cracks may extend in the first direction, a second direction or a third direction. The second direction may include a direction parallel to the X axis. The third direction may include a direction parallel to the Y axis.

When the cracks extend to the second test ring 132 in the second direction or the third direction, since the material of the second test ring 132 is different from the material of the base 120, the second test ring 132 may prevent the cracks from further extending in the second direction or the third direction. In this way, the protection structure 130 may control the cracks near the TSV 110 within an area between the protection structure 130 and the TSV 110, so as to reduce the probability that the cracks further extend to the outer side of the protection structure 130 away from the TSV 110. That is, the protection structure 130 provides the stress protection for devices on the outer side of the protection structure 130 away from the TSV 110.

Similarly, the protection structure 130 may also prevent the cracks formed on the outer side of the protection structure away from the TSV 110 from extending to the TSV 110. That is, the protection structure 130 also provides the stress protection for the TSV 110.

It needs to be emphasized that in a plane perpendicular to the first direction, a cross-sectional shape of the protection structure 130 is a closed shape (for example, a rectangle, an octagon, a dodecagon, an ellipse or a circle, etc.), and each of a cross-sectional shape of the first test ring 131 and a cross-sectional shape of the second test ring 132 is also a closed shape. The TSV 110 is completely surrounded by the first test ring 131, and the TSV 110 is completely surrounded by the second test ring 132. In this way, the protection structure 130 can provide the better stress protection. In addition, crack detection can be performed in this plane in all directions around the TSV 110, which is beneficial to improve the comprehensiveness and accuracy of the crack detection.

The material of the first dielectric layer 133 may include a low dielectric constant material, such as silicon dioxide or tetraethyl orthosilicate.

The material of the first connection layer 134 is a conductive material, which may include a conductive metal, such as copper or tungsten. With reference to FIG. 1B, the first connection layer 134 may be arranged substantially parallel to a plane in which the base 120 is located. In some embodiments, there may be a certain angle between the first connection layer 134 and the base 120.

In the semiconductor structure 100 provided in the embodiments of the disclosure, the protection structure 130 is arranged around the TSV 110, so that the protection structure 130 can locally release the stress in the TSV 110. Moreover, the protection structure 130 can also be used to isolate the stress. Specifically, the protection structure 130 can isolate stress transfer between the TSV 110 and a peripheral structure of the protection structure 130, so as to reduce the interaction between the stress in the TSV 110 and the stress in the peripheral structure, so that the TSV 110 and the peripheral structure can be protected to a certain extent, which is beneficial to ensure that the formed device has a better quality.

In addition, the conductive first test ring 131 and the conductive second test ring 132 in the protection structure 130 are respectively electrically insulated from the TSV 110 via the dielectric material, and the first connection layer 134 in the first dielectric layer 133 is electrically connected to the first test ring 131 and the second test ring 132, so that the first electrical signal may be provided to the first contact 1311 at the end of the first test ring 131 and the second contact 1321 at the end of the second test ring 132, so as to determine the first electrical parameter of the first path arranged in the protection structure 130 and electrically connected to the first contact 1311 and the second contact 1321, thereby determining whether cracks appear in the TSV 110 according to the first electrical parameter to implement the stress detection (i.e., the crack detection). Thus, the testing method is simple and fast.

Moreover, the first test ring 131 and the second test ring 132 included in the protection structure 130 are conductive. Therefore, when the first test ring 131 and the second test ring 132 are grounded, electromagnetic shielding can also be performed on the TSV 110 by the first test ring 131 and the second test ring 132.

Figure 2A:
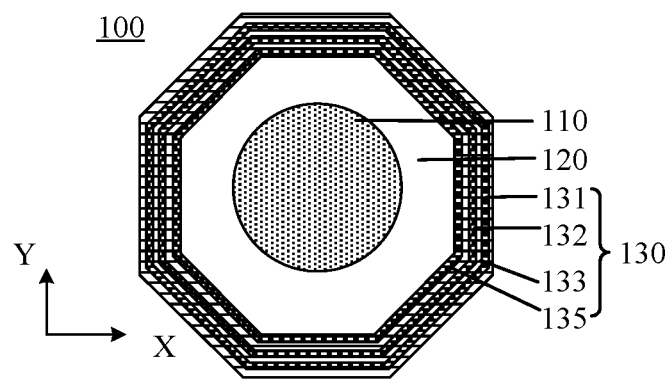
FIG. 2A is a top view of another semiconductor structure according to some embodiments.
Figure 2B:
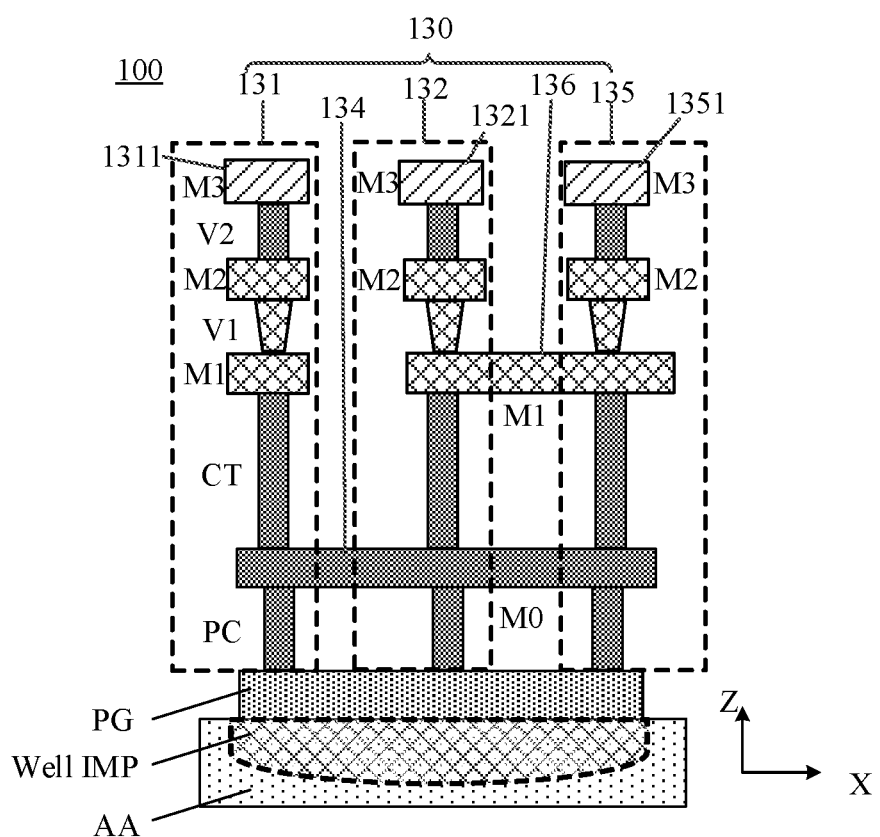
FIG. 2B is a partial schematic cross-sectional view of another semiconductor structure according to some embodiments.

In some embodiments, with reference to FIG. 2A and FIG. 2B, the protection structure 130 further includes:
 a conductive third test ring 135 vertically penetrating through the base 120, arranged around the TSV 110, and located between the second test ring 132 and the TSV 110, in which an end of the third test ring 135 includes a third contact 1351; and
 a second connection layer 136 located between the second test ring 132 and the third test ring 135, and configured to be electrically connected to the second test ring 132 and the third test ring 135, in which the second connection layer 136 is located between the third contact 1351 and the first connection layer 134 in a direction perpendicular to the base 120.

The material of the third test ring 135 may include copper or tungsten. The third contact 1351 is configured to receive an electrical signal applied to the third test ring 135. The third contact 1351, the first contact 1311, and the second contact 1321 may be, for example, made of the same material, such as aluminum.

The material of the second connection layer 136 is a conductive material, which may include a conductive metal, such as copper or tungsten. With reference to FIG. 2B, the second connection layer 136 may be arranged substantially parallel to the plane in which the base 120 is located. In some embodiments, there may be a certain angle between the second connection layer 136 and the base 120. It may be understood that in the direction perpendicular to the base 120, the second connection layer 136 only needs to be arranged between a plane in which the third contact 1351 is located and a plane in which the first connection layer 134 is located.

It may be understood that a second dielectric layer (not shown in the figure) may be further provided between the third test ring 135 and the second test ring 132, which is configured to electrically isolate the third test ring 135 from the second test ring 132. The material of the second dielectric layer may be the same as the material of the first dielectric layer 133.

The second connection layer 136 is located in the second dielectric layer. It needs to be emphasized that the second test ring 132 and the third test ring 135 are electrically connected to each other through the second connection layer 136.

In some embodiments, with reference to FIG. 2B, the first connection layer 134 is electrically connected to the first test ring 131, the second test ring 132, and the third test ring 135.

In some other embodiments, the first connection layer 134 is only electrically connected to the first test ring 131 and the second test ring 132, but cannot be electrically connected to the second test ring 132 and the third test ring 135.

It needs to be emphasized that when the arrangement methods of the first connection layer 134 are different, the conductive paths that may be formed among the first contact 1311, the second contact 1321, and the third contact 1351 are different. Therefore, when the stress detection (i.e., the crack detection) is performed by using the semiconductor structure 100, there may be differences in the specific determination conditions, which will be described in detail in the testing method provided in subsequent embodiments of the disclosure.

In the embodiments of the disclosure, the third test ring 135 and the second connection layer 136 are provided, which is beneficial to accurately determine the position at which the cracks are formed, so that the accuracy of the crack test can be improved.

In some embodiments, the protection structure 130 includes N third test rings 135 and N second connection layers 136. A first third test ring 135 to an $(N-1)^{th}$ third test ring 135 are located between the second test ring 132 and an $N^{th}$ third test ring 135. N is a positive integer greater than 1.

A first second connection layer 136 is configured to be electrically connected to the second test ring 132 and the first third test ring 135.

A $K^{th}$ second connection layer 136 is configured to be electrically connected to a $K^{th}$ third test ring 135 and a $(K+1)^{th}$ third test ring 135. K is a positive integer less than N.

It may be understood that when the number of the third test rings 135 and second connection layers 136 is increased, the area occupied by the protection structure 130 is larger. Therefore, the number of the third test rings 135 and the number of the second connection layers 136 may be determined according to actual requirements.

In the embodiments of the disclosure, a plurality of third test rings 135 and a plurality of second connection layers 136 are provided, so that analysis may be performed layer by layer, so as to determine which two adjacent second connection layers 136 between which the cracks specifically exist, and/or, to determine whether the cracks exist between the first connection layer 134 and the second connection layer 136 which is closest to the first connection layer, which is beneficial to further accurately determine the position at which the cracks are formed, thereby further improving the accuracy of the crack detection.

In some embodiments, in a direction parallel to the plane in which the base 120 is located,
the cross-sectional shape of the first test ring 131 includes a regular polygonal shape or an annular shape;
the cross-sectional shape of the second test ring 132 includes a regular polygonal shape or an annular shape, in which a center of symmetry of the cross-sectional shape of the first test ring 131 coincides with a center of symmetry of the cross-sectional shape of the second test ring 132; and
a center of a cross-section of the TSV 110 covers the center of symmetry of the cross-sectional shape of the first test ring 131.

Exemplary, in the direction parallel to the plane in which the base 120 is located, when the cross-sectional shape of the first test ring 131 is a regular polygon, and the cross-sectional shape of the second test ring 132 is also a regular polygon, the cross-sectional shape of the first test ring 131 may be the same as or different from the cross-sectional shape of the second test ring 132. For example, the cross-sectional shape of the first test ring 131 may be a square, and the cross-sectional shape of the second test ring 132 may be a regular triangle, a square, a regular hexagon, a regular octagon, a regular dodecagon or a circle.

It needs to be emphasized that in the direction parallel to the plane in which the base 120 is located, there is no interaction between the cross-sectional shape of the first test ring 131 and the cross-sectional shape of the second test ring 132.

Preferably, in the direction parallel to the plane in which the base 120 is located, the cross-sectional shape of the first test ring 131 is the same as the cross-sectional shape of the second test ring 132. The center of symmetry of the cross-sectional shape of the first test ring 131 coincides with the center of symmetry of the cross-sectional shape of the second test ring 132. Thus, distances between the respective points on the first test ring 131 and on the second test ring 132 are the same.

Exemplary, in the direction parallel to the plane in which the base 120 is located, a cross-sectional shape of the TSV 110 may include a circle, a square, or a rectangle etc. Preferably, the TSV 110 is cylindrical. In the direction parallel to the plane in which the base 120 is located, the cross-sectional shape of the TSV 110 is a circle. In this way, the difficulty of forming the via by etching can be reduced, and the difficulty of filling a conductive material into the via to form the TSV 110 can be reduced.

In the direction parallel to the plane in which the base 120 is located, the center of the cross-section of the TSV 110 covers the center of symmetry of the cross-sectional shape of the first test ring 131. That is, the center of the cross-section of the TSV 110 overlaps with the center of symmetry of the cross-sectional shape of the first test ring 131. In this way, the layout of the protection structure 130 may be optimized, thereby reducing the occupation of the area of the base 120 by the protection structure 130.

In some embodiments, in the direction parallel to the plane in which the base 120 is located, a cross-sectional shape of the third test ring 135 includes a regular polygonal shape or an annular shape. A center of symmetry of the cross-sectional shape of the third test ring 135 coincides with the center of symmetry of the cross-sectional shape of the second test ring 132, and the center of the cross-section of the TSV 110 coincides with the center of symmetry of the cross-sectional shape of the third test ring 135.

Exemplary, in the direction parallel to the plane in which the base 120 is located, the cross-sectional shape of the third test ring 135 may be different from the cross-sectional shape of the first test ring 131 and/or the cross-sectional shape of the second test ring 132. It needs to be emphasized that in the direction parallel to the plane in which the base 120 is located, there is no interaction between the cross-sectional shape of the third test ring 135 and the cross-sectional shape of the first test ring 131, and there is no intersection between the cross-sectional shape of the third test ring 135 and the cross-sectional shape of the second test ring 132.

Preferably, in the direction parallel to the plane in which the base 120 is located, the cross-sectional shape of the first test ring 131, the cross-sectional shape of the second test ring 132, and the cross-sectional shape of the third test ring 135 are the same, and the centers of symmetry of the first test ring 131, the second test ring 132, and the third test ring 135 coincides with each other. In this way, distances between the respective points on the third test ring 135 and on the first test ring 131 are the same, and distances between the respective points on the third test ring 135 and on the second test ring 132 are the same.

Figure 3:
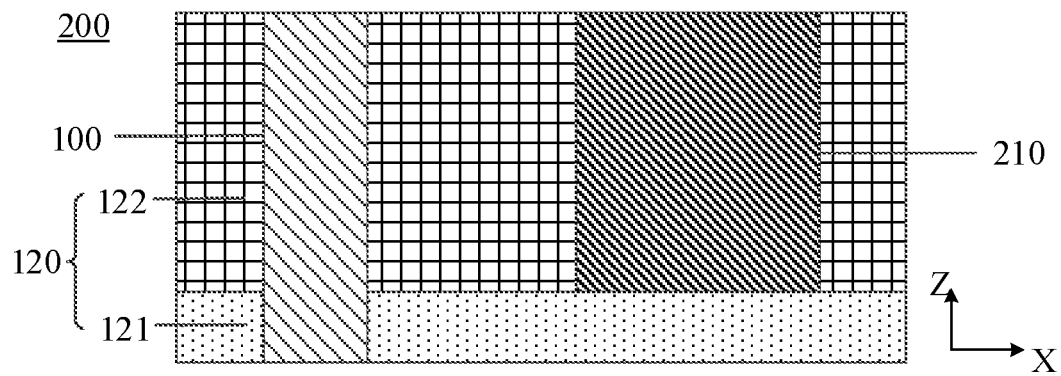
FIG. 3 is a schematic diagram of a memory according to some embodiments.

FIG. 3 is a schematic diagram of a memory 200 according to an exemplary embodiment. With reference to FIG. 3, the memory 200 includes:

a semiconductor structure 100, in which a base 120 includes a substrate 121 and an insulating layer 122 covering the substrate 121; and a storage element 210 arranged in the insulating layer 122.

Exemplary, the memory 200 includes, but is not limited to, a Dynamic Random Access Memory (DRAM), a three-dimensional NAND memory, or a phase change memory etc.

In the memory 200, the TSV 110 in the semiconductor structure 100 may electrically connect the functional structures arranged on both sides of the base 120 with each other, and/or, the TSV 110 in the semiconductor structure 100 may be configured to perform the crack test.

It may be understood that when the TSV 110 in the semiconductor structure 100 is configured to perform the crack test, the semiconductor structure 100 is a test structure. The TSV 110 in the semiconductor structure cannot electrically connect the functional structures with each other.

It needs to be emphasized that the storage element 210 is arranged on an outer side of the protection structure 130 away from the TSV 110, and the protection structure 130 is located between the storage element 210 and the TSV 110.

In the memory 200 provided in the embodiments of the disclosure, the semiconductor structure 100 is provided, and the protection structure 130 in the semiconductor structure 100 can locally release the stress in the TSV 110. Moreover, the protection structure 130 can also be used to isolate the stress. Specifically, the protection structure 130 can isolate stress transfer between the TSV 110 and a peripheral structure (for example, the storage element 210) of the protection structure 130, so as to reduce the interaction between the stress in the TSV 110 and the stress in the peripheral structure, so that the TSV 110 and the peripheral structure can be protected to a certain extent, which is beneficial to ensure that the memory 200 has a better quality.

In addition, the conductive first test ring 131 and the conductive second test ring 132 in the protection structure 130 are both electrically insulated from the TSV 110, and the first connection layer 134 in the first dielectric layer 133 is electrically connected to the first test ring 131 and the second test ring 132, so that the first electrical signal may be provided to the first contact 1311 at the end of the first test ring 131 and the second contact 1321 at the end of the second test ring 132, so as to determine the first electrical parameter of the first path arranged in the protection structure 130 and electrically connected to the first contact 1311 and the second contact 1321, thereby determining whether cracks appear in the TSV 110 according to the first electrical parameter. Thus, the testing method is simple and fast.

It needs to be emphasized that when the semiconductor structure 100 is only configured to perform the crack test, the memory 200 may further include other preset structures which have the same structure as the semiconductor structure 100 and are configured to electrically connect the structures stacked on one another with each other. The preset structures and the semiconductor structure 100 used for testing may be simultaneously formed. In this way, the quality of the preset structures may be reflected according to test results of the semiconductor structure 100 used for testing. Further, the subsequent manufacturing process of the preset structures may further be adjusted according to the test results of the semiconductor structure 100 used for testing, so as to improve the quality of the above-mentioned formed preset structures, thereby improving the quality of the memory 200.

Moreover, the first test ring 131 and the second test ring 132 included in the protection structure 130 are conductive. Therefore, when the first test ring 131 and/or the second test ring 132 are grounded, electromagnetic shielding can also be performed on the TSV 110 by the protection structure 130.

In some embodiments, the memory 200 further includes:

a conductive interconnection structure electrically connected to the storage element 210.

The interconnection structure and the protection structure 130 are simultaneously formed.

In the first direction, the conductive interconnection structure may include a first conductive contact (PC), an initial metal layer (M0), a second conductive contact (CT), a first metal layer (M1), a first conductive via (V1), a second metal layer (M2), a second conductive via (V2), and a third metal layer (M3) stacked on one another.

With reference to FIG. 1B, in the first direction, the first test ring 131 may include the first conductive contact, the second conductive contact, the first metal layer, the first conductive via, the second metal layer, the second conductive via, and the third metal layer (that is, the first contact 1311) sequentially stacked on one another. The second test ring 132 may include the first conductive contact, the second conductive contact, the first metal layer, the first conductive via, the second metal layer, the second conductive via, and the third metal layer (that is, the second contact 1321) sequentially stacked on one another.

It needs to be emphasized that the same structures in the interconnection structure, in the first test ring 131, and in the second test ring 132 are simultaneously formed. For example, the first conductive contact in the interconnection structure, the first conductive contact in the first test ring 131, and the first conductive contact in the second test ring 132 are simultaneously formed. The second conductive contact in the interconnection structure, the second conductive contact in the first test ring 131, and the second conductive contact in the second test ring 132 are simultaneously formed. The first metal layer in the interconnection structure, the first metal layer in the first test ring 131, and the first metal layer in the second test ring 132 are simultaneously formed, and so on, the third metal layer in the interconnection structure, the third metal layer in the first test ring 131, and the third metal layer in the second test ring 132 are simultaneously formed. The first connection layer 134 and the initial metal layer in the interconnection structure may be simultaneously formed.

Exemplary, as shown in FIG. 1B, one end of the first connection layer 134 may be arranged between the first conductive contact and the second conductive contact of the first test ring 131. The other end of the first connection layer 134 may be arranged between the first conductive contact and the second conductive contact of the second test ring 132.

In some other embodiments, the first conductive contact and the second conductive contact of the first test ring 131 are directly in contact with each other. The first conductive contact and the second conductive contact of the second test ring 132 are directly in contact with each other. One end of the first connection layer 134 contacts the first conductive contact and/or the second conductive contact of the first test ring 131, and the other end of the first connection layer 134 contacts the first conductive contact and/or the second conductive contact of the second test ring 132.

When the semiconductor structure 100 includes the second connection layer 136, the second connection layer 136 and the first metal layer in the interconnection structure are simultaneously formed. In this case, the second connection layer 136, the first metal layer in the first test ring 131, and the first metal layer in the second test ring 132 are simultaneously formed, and the second connection layer 136, the first metal layer in the first test ring 131, and the first metal layer in the second test ring 132 may be formed as an integral structure.

In this way, the protection structure 130 may be formed while forming the interconnection structure. Compared with the fact that the interconnection structure and the protection structure 130 are separately formed in a time sequence, the simultaneous formation of the interconnection structure and the protection structure 130 can optimize process steps, thereby improving the efficiency.

In some embodiments, the memory 200 further includes: a transistor located on a surface of the substrate 121.

An end of the protection structure 130 is electrically connected to a gate of the transistor, and the other end of the protection structure 130 is configured to receive an external electrical signal.

With reference to FIG. 1B, the gate (PG) of the transistor may be located on the surface of the substrate 121. Ion implantation may be performed in the active area of the substrate 121, so as to form an ion implantation well (Well IMP).

It may be understood that the other end of the protection structure 130 described above is the end of the protection structure provided with the first contact 1311 and the second contact 1321. When the protection structure 130 includes the third test ring 135, the first contact 1311, the second contact 1321, and the third contact 1351 are located at the same end of the protection structure 130. Therefore, the other end of the protection structure 130 described above is also the end of the protection structure provided with the third contact 1351.

In some embodiments, the other end of the protection structure 130 described above is grounded.

In some embodiments, the substrate 121 includes: a dicing street located between two adjacent storage chip areas; and a plurality of semiconductor structures 100 equally spaced apart from each other in the dicing street.

It may be understood that when the semiconductor structure 100 is arranged in the dicing street, the semiconductor structure 100 is only used as a test structure for the crack test.

In the embodiments of the disclosure, the semiconductor structure 100 used for the crack test is arranged in the dicing street, so that the occupation of the effective area of the surface of the base 120 for arranging the storage element 210 can be reduced, without affecting the integration of the memory 200.

In addition, the plurality of semiconductor structures 100 are arranged at equal intervals in the dicing street, so that the plurality of semiconductor structures 100 may be tested to obtain more accurate stress detection results.

Figure 4:
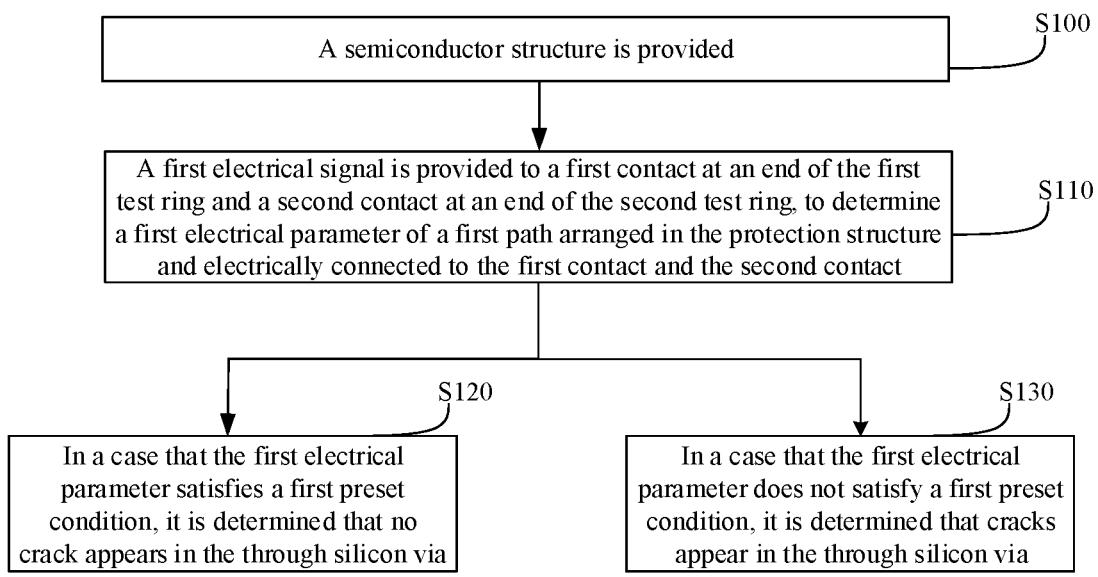
FIG. 4 is a flowchart of a crack testing method according to some embodiments.

FIG. 4 is a flowchart of a crack testing method according to an exemplary embodiment. The crack testing method may be used for testing the semiconductor structure 100 provided in the embodiments of the disclosure, so as to test whether cracks exist in the semiconductor structure 100. With reference to FIG. 4, the crack testing method includes the following operations.

In S100, a semiconductor structure is provided.

In S110, a first electrical signal is provided to a first contact at an end of the first test ring and a second contact at an end of the second test ring, so as to determine a first electrical parameter of a first path arranged in the protection structure and electrically connected to the first contact and the second contact.

In S120, in a case that the first electrical parameter satisfies a first preset condition, it is determined that no crack appears in a through silicon via.

In S130, in a case that the first electrical parameter does not satisfy a first preset condition, it is determined that cracks appear in a through silicon via.

Figure 5:
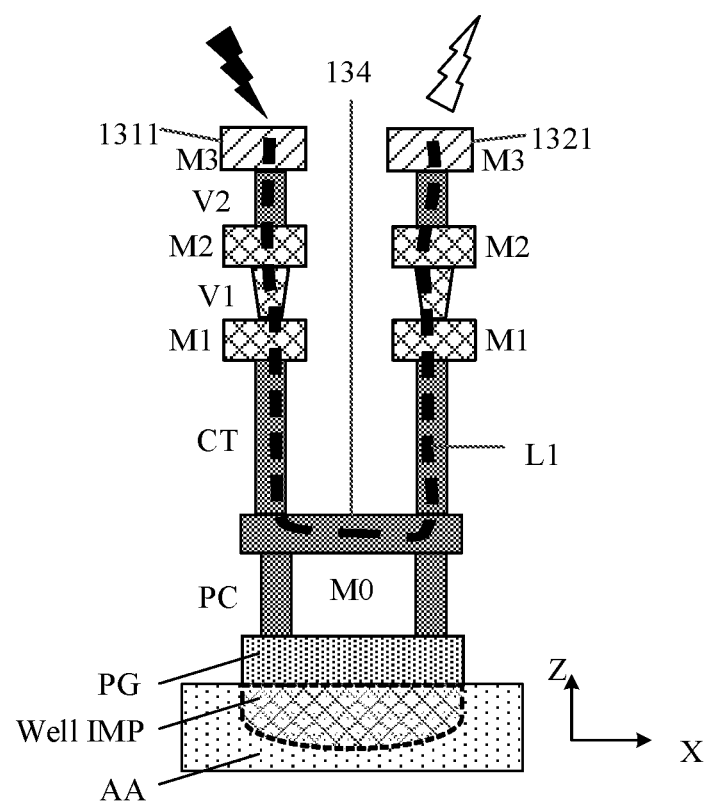
FIG. 5 is a schematic diagram of a crack testing method according to some embodiments.

In S110, the first path may include a path L1 shown in FIG. 5. The first electrical signal may include a voltage signal or a current signal.

S110 may include the following operation. A preset voltage signal is provided to the first contact and the second contact, in which there is a voltage difference between the first contact and the second contact, so as to provide a current signal to a path between the first contact and the second contact. Alternatively, S110 may include the following operation. A current signal is provided to the first contact and the second contact.

Exemplary, the first electrical parameter may include a voltage difference, a current or a resistance. An example in which the first electrical parameter is a resistance is described below.

S110 may further include the following operations. The voltage difference between the first contact and the second contact is measured. Further, a resistance between the first contact and the second contact may be determined according to the current signal provided to the first contact and the second contact, and the measured voltage difference between the first contact and the second contact. It may be understood that when the first contact is only connected to the second contact by the first path, the determined resistance is the resistance of the first path.

In S120 and S130, taking that the first electrical parameter is a voltage difference as an example, the first preset condition may include that the first electrical parameter is less than or equal to a first voltage difference threshold.

Taking that the first electrical parameter is a resistance as an example, the first preset condition may include that the first electrical parameter is less than or equal to a first resistance threshold. In an actual application, when there is no crack around the TSV 110, the resistance between the first contact and the second contact is within a certain range (for example, less than or equal to the first resistance threshold). When the cracks appear in the TSV 110, the cracks usually extend to the protection structure 130. As a result, at least one test ring (for example, the first test ring 131, the second test ring 132 or the third test ring 135) in the protection structure 130 at least partially fractures, resulting in the measured resistance (for example, greater than the first resistance threshold) of the first contact and the second contact is increased.

Specifically, taking the semiconductor structure 100 shown in FIG. 1A as an example, when the cracks appear in the TSV 110, in the direction parallel to the substrate 121, the cracks extend to the second test ring 132. As a result, the second test ring 132 fractures, and the first path between the first contact 1311 and the second contact 1321 is partially or completely disconnected. In this case, the resistance of the first path is large, and is greater than the first resistance threshold. Exemplary, when a positive voltage is supplied to the first contact 1311 and a negative voltage is supplied to the second contact 1321 by the power supply, and the first path is turned on, the current may flow along the first test ring 131, the first connection layer 134, and the second test ring 132. When the first path is partially disconnected, the current may still flow along the first test ring 131, the first connection layer 134, and the second test ring 132. However, in this case, the resistance of the first path is greater than the first resistance threshold. When the first path is completely disconnected, no current path can be formed along the first test ring 131, the first connection layer 134, and the second test ring 132.

In the crack testing method provided in the embodiments of the disclosure, the first electrical signal may be provided to the first contact 1311 at the end of the first test ring 131 and the second contact 1321 at the end of the second test ring 132, so as to determine the first electrical parameter of the first path arranged in the protection structure 130 and electrically connected to the first contact 1311 and the second contact 1321, thereby determining whether the cracks appear in the TSV 110 according to the first electrical parameter. Thus, the testing method is simple and fast.

In some embodiments, the protection structure 130 further includes the conductive third test ring 135 and the second connection layer 136. The second connection layer 136 is electrically connected to the second test ring 132 and the third test ring 135.

The crack testing method further includes the following operations.

A second electrical signal is provided to the second contact 1321 and the third contact 1351 at the end of the third test ring 135, so as to determine a second electrical parameter of a second path (for example, a path L2 shown in FIG. 6A) arranged in the protection structure 130 and electrically connected to the second contact 1321 and the third contact 1351.

In a case that the first electrical parameter satisfies the first preset condition and the second electrical parameter satisfies a second preset condition, it is determined that no crack appears in the TSV 110.

In a case that the first electrical parameter does not satisfy the first preset condition, it is determined that cracks appear in a first area of the TSV 110 closer to the first connection layer 134.

In a case that the second electrical parameter does not satisfy a second preset condition, it is determined that cracks appear in a second area of the TSV 110 closer to the second connection layer 136.

Exemplary, the second electrical parameter includes at least one of: a resistance, a current, or a voltage difference.

Taking that the second electrical parameter is a resistance as an example, the second preset condition includes that the resistance is less than a second resistance threshold.

Figure 6A:
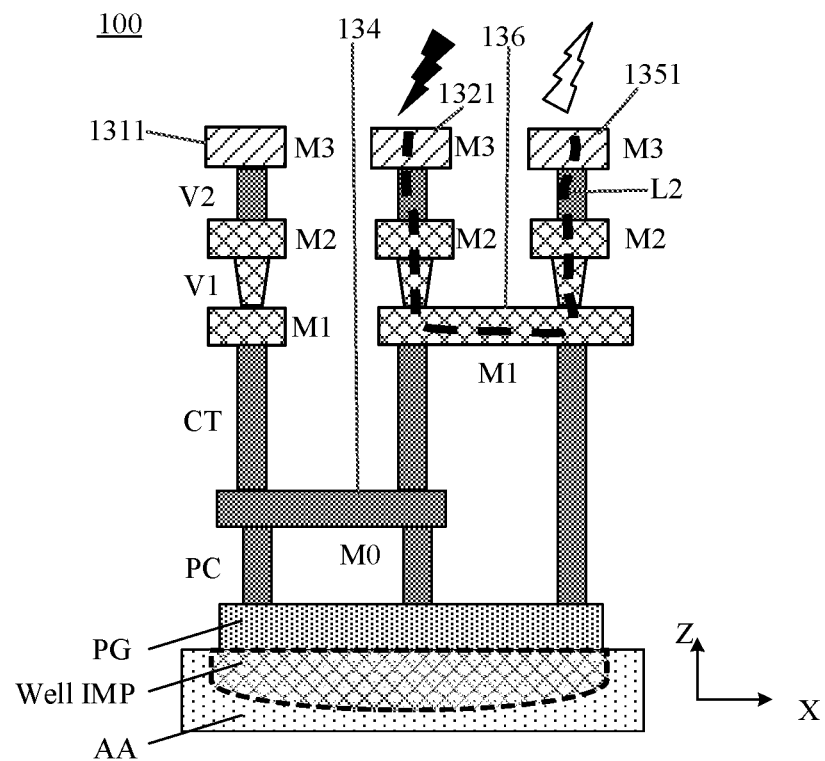
FIG. 6A is a first schematic diagram of another crack testing method according to some embodiments.
Figure 6B:
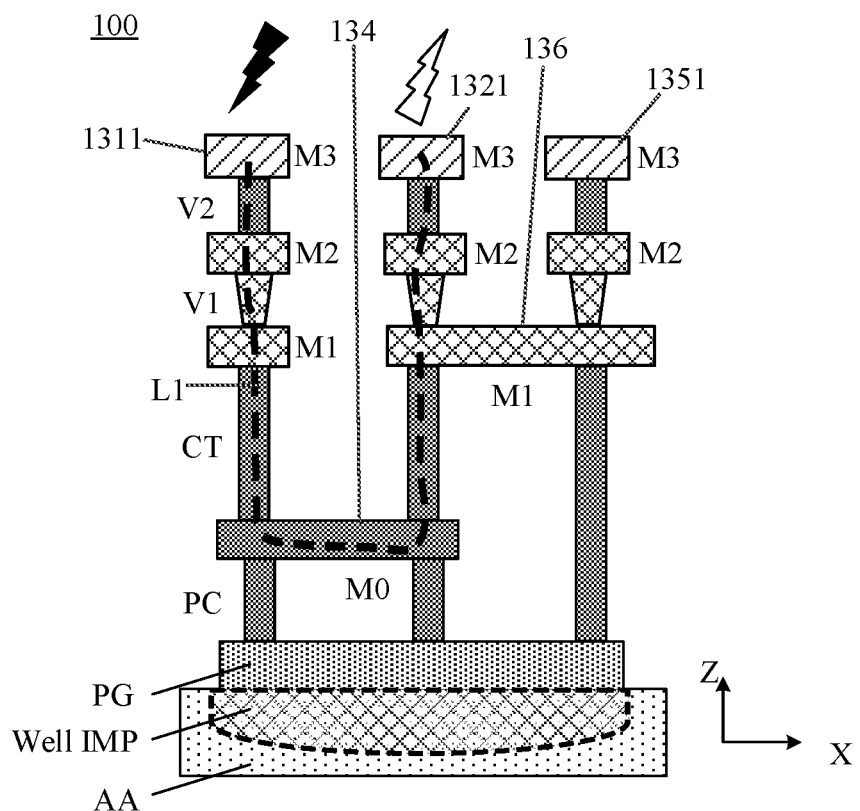
FIG. 6B is a second schematic diagram of another crack testing method according to some embodiments.

With reference to FIG. 6A and FIG. 6B, the first area includes an area arranged in the semiconductor structure 100 between a first plane in which the first connection layer 134 is located and a second plane in which the second connection layer 136 is located.

The second area includes an area arranged in the semiconductor structure 100 between the second plane in which the second connection layer 136 is located and a third plane in which the first contact 1311 and the second contact 1321 are located.

It may be understood that in the embodiments of the disclosure, the first connection layer 134 does not directly contact the third test ring 135, the first connection layer 134 is electrically connected to the first test ring 131 and the second test ring 132, and the second test ring 132 and the third test ring 135 are not electrically connected to each other by the first connection layer 134. However, when an electrical connection path between the first connection layer 134 and the second connection layer 136 is not disconnected, the first connection layer 134 can still implement an electrical connection to the third test ring 135 through the second test ring 132 and the second connection layer 136.

Similarly, in the embodiments of the disclosure, the second connection layer 136 does not directly contact the first test ring 131. When the electrical connection path between the first connection layer 134 and the second connection layer 136 is not disconnected, the second connection layer 136 can still implement an electrical connection to the first test ring 131 through the second test ring 132 and the first connection layer 134.

In the testing method provided in the embodiments of the disclosure, analysis may be performed layer by layer, so as to further determine the area in which the cracks exist, thereby further improving the accuracy of the crack detection.

Figure 7A:
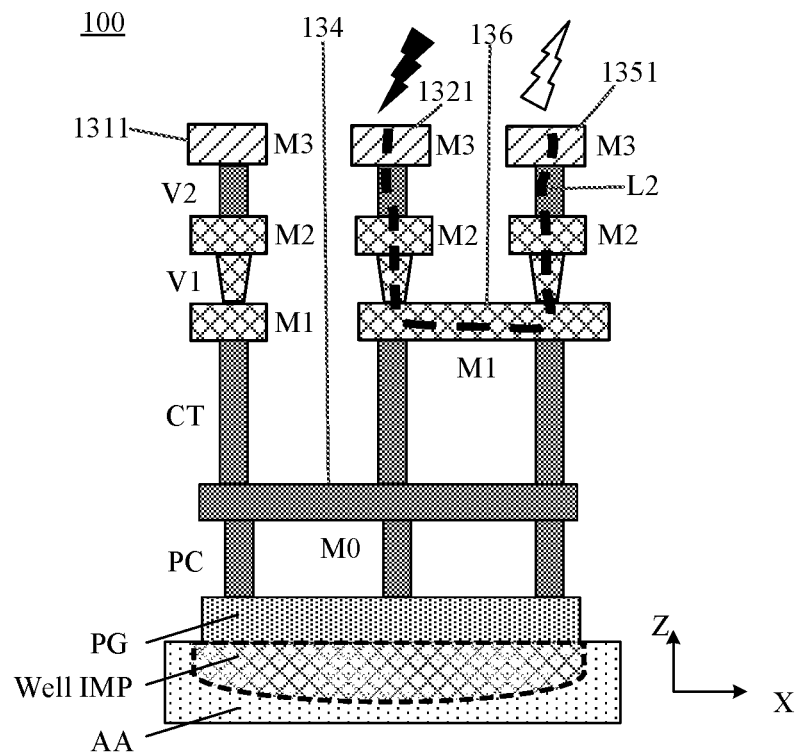
FIG. 7A is a first schematic diagram of still another crack testing method according to some embodiments.
Figure 7B:
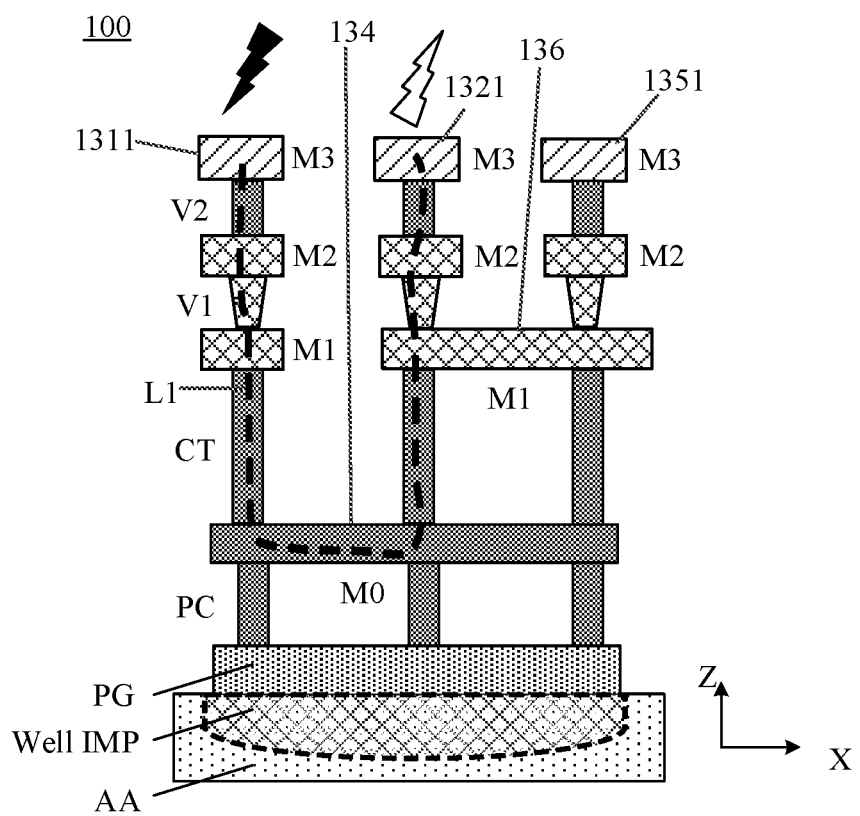
FIG. 7B is a second schematic diagram of still another crack testing method according to some embodiments.

In some embodiments, with reference to FIG. 7A and FIG. 7B, the protection structure 130 further includes the conductive third test ring 135 and the second connection layer 136. The first connection layer 134 is electrically connected to the first test ring 131, the second test ring 132, and the third test ring 135. The crack testing method further includes the following operations.

A second electrical signal is provided to the second contact 1321 and the third contact 1351 at the end of the third test ring 135, so as to determine a second electrical parameter of a second path arranged in the protection structure 130 and electrically connected to the second contact 1321 and the third contact 1351.

In a case that the first electrical parameter satisfies the first preset condition and the second electrical parameter satisfies a second preset condition, it is determined that no crack appears in the TSV 110.

In a case that the first electrical parameter does not satisfy the first preset condition and the second electrical parameter satisfies a second preset condition, it is determined that cracks appear in an area of the TSV 110 close to the first connection layer 134 between the first test ring 131 and the second test ring 132.

In a case that the first electrical parameter satisfies the first preset condition and the second electrical parameter does not satisfy a second preset condition, it is determined that cracks appear in an area of the TSV 110 close to the first connection layer 134 between the first test ring 131 and the second test ring 132.

Figure 8:
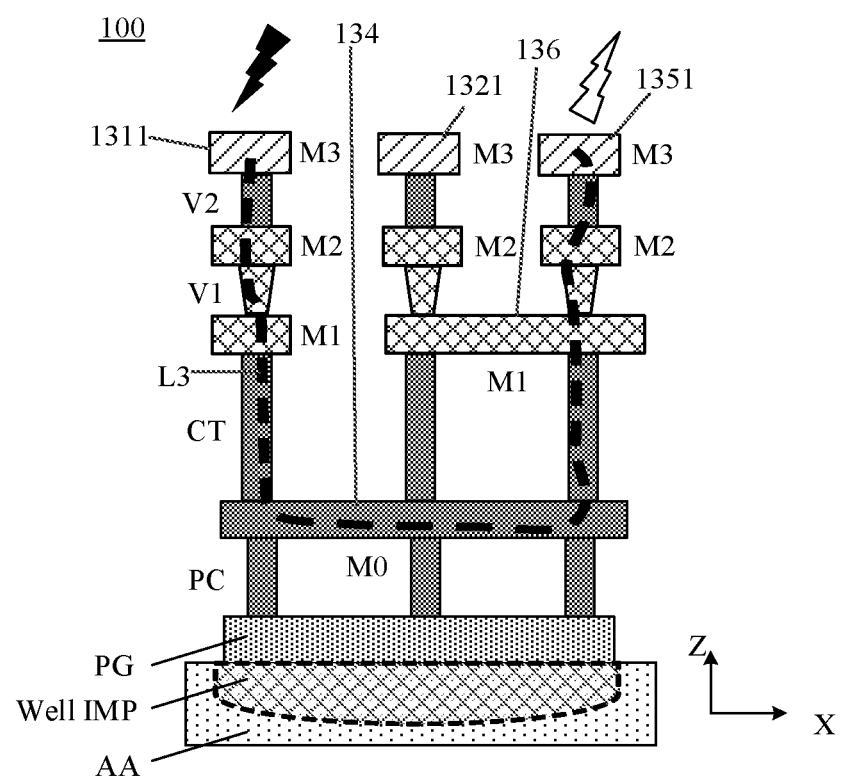
FIG. 8 is a schematic diagram of yet another crack testing method according to some embodiments.

In some embodiments, with reference to FIG. 8, the crack testing method may further include the following operations.

A third electrical signal is provided to the first contact 1311 and the third contact 1351, so as to determine a third electrical parameter of a third path (for example, the path L3) arranged in the protection structure 130 and electrically connected to the first contact 1311 and the second contact 1321.

In a case that the third electrical parameter satisfies a third preset condition, it is determined that no crack appears in the TSV 110.

In a case that the third electrical parameter does not satisfy the third preset condition, it is determined that cracks appear in the TSV 110.

Taking that the third electrical parameter is a resistance as an example, the third preset condition includes that the resistance is less than a third resistance threshold.

It needs to be emphasized that the values of the first resistance threshold, the second resistance threshold, and the third resistance threshold may be set according to an actual situation. The first resistance threshold, the second resistance threshold, and the third resistance threshold may be at least partially the same or completely different from each other.

In the embodiments provided in the disclosure, it should be understood that the disclosed apparatus, system, and method may be implemented in other manners. The above descriptions are merely specific implementations of the disclosure, and are not intended to limit the protection scope of the disclosure. It is easy for those skilled in the art to convince modifications or substitutions within the technical scope disclosed in the embodiments of the disclosure. These modifications or substitutions are within the scope of the embodiments of the disclosure. Therefore, the protection scope of the disclosure is subject to the protection scope of the claims.

What is claimed is:

1. A semiconductor structure, comprising:
   a through silicon via penetrating through a base; and
   a protection structure, comprising:
      a conductive first test ring and a conductive second test ring both arranged around the through silicon via and electrically insulated from the through silicon via;
      a first dielectric layer located between the first test ring and the second test ring and configured to electrically isolate the first test ring from the second test ring; and
      a first connection layer located in the first dielectric layer and configured to be electrically connected to the first test ring and the second test ring.

2. The semiconductor structure according to claim 1, wherein the protection structure further comprises:
   at least one conductive third test ring vertically penetrating through the base, arranged around the through silicon via, and located between the second test ring and the through silicon via, wherein an end of the at least one third test ring comprises a third contact; and
   at least one second connection layer located between the second test ring and the at least one third test ring, and configured to be electrically connected to the second test ring and the at least one third test ring, wherein the at least one second connection layer is located between the third contact and the first connection layer in a direction perpendicular to the base.

3. The semiconductor structure according to claim 2, wherein
   the protection structure comprises N third test rings and N second connection layers, wherein a first third test ring of the N third test rings to an $(N-1)^{th}$ third test ring of the N third test rings are located between the second test ring and an $N^{th}$ third test ring of the N third test rings, wherein N is a positive integer greater than 1;
   a first second connection layer of the N second connection layers is configured to be electrically connected to the second test ring and the first third test ring; and
   a $K^{th}$ second connection layer of the N second connection layers is configured to be electrically connected to a $K^{th}$ third test ring of the N third test rings and a $(K+1)^{th}$ third test ring of the N third test rings, wherein K is a positive integer less than N.

4. The semiconductor structure according to claim 2, wherein
   the first connection layer is configured to be electrically connected to the first test ring, the second test ring, and the at least one third test ring.

5. The semiconductor structure according to claim 1, wherein in a direction parallel to a plane in which the base is located,
   a cross-sectional shape of the first test ring comprises a regular polygonal shape or an annular shape;
   a cross-sectional shape of the second test ring comprises a regular polygonal shape or an annular shape, wherein a center of symmetry of the cross-sectional shape of the first test ring coincides with a center of symmetry of the cross-sectional shape of the second test ring; and
   a center of a cross-section of the through silicon via covers the center of symmetry of the cross-sectional shape of the first test ring.

6. A memory, comprising:
   at least one semiconductor structure, wherein the semiconductor structure comprises a through silicon via penetrating through a base, and a protection structure, and wherein the protection structure comprises: a conductive first test ring and a conductive second test ring both arranged around the through silicon via and electrically insulated from the through silicon via; a first dielectric layer located between the first test ring and the second test ring and configured to electrically isolate the first test ring from the second test ring; and a first connection layer located in the first dielectric layer and configured to be electrically connected to the first test ring and the second test ring, and the base comprises a substrate and an insulating layer covering the substrate; and
   a storage element arranged in the insulating layer.

7. The memory according to claim 6, further comprising:
   a conductive interconnection structure electrically connected to the storage element,
   wherein the interconnection structure and the protection structure are simultaneously formed.

8. The memory according to claim 7, further comprising:
   a transistor located on a surface of the substrate,
   wherein an end of the protection structure is electrically connected to a gate of the transistor, and the other end of the protection structure is configured to receive an external electrical signal.

9. The memory according to claim 8, wherein the other end of the protection structure is grounded.

10. The memory according to claim 6, wherein the substrate comprises:
    a dicing street located between two adjacent storage chip areas; and
    a plurality of semiconductor structures equally spaced apart from each other in the dicing street.

11. A crack testing method for testing a semiconductor structure, the semiconductor structure comprising a through silicon via penetrating through a base, and a protection structure, the protection structure comprising: a conductive first test ring and a conductive second test ring both arranged around the through silicon via and electrically insulated from the through silicon via; a first dielectric layer located between the first test ring and the second test ring and configured to electrically isolate the first test ring from the second test ring; and a first connection layer located in the first dielectric layer and configured to be electrically connected to the first test ring and the second test ring, the crack testing method comprising:

providing the semiconductor structure;

providing a first electrical signal to a first contact at an end of the first test ring and a second contact at an end of the second test ring, to determine a first electrical parameter of a first path arranged in the protection structure and electrically connected to the first contact and the second contact;

in a case that the first electrical parameter satisfies a first preset condition, determining that no crack appears in the through silicon via; or in a case that the first electrical parameter does not satisfy a first preset condition, determining that cracks appear in the through silicon via.

12. The crack testing method according to claim 11, wherein the protection structure further comprises a conductive third test ring and a second connection layer, and the second connection layer is configured to be electrically connected to the second test ring and the third test ring; and wherein the crack testing method further comprises:

providing a second electrical signal to the second contact and a third contact at an end of the third test ring, to determine a second electrical parameter of a second path arranged in the protection structure and electrically connected to the second contact and the third contact;

in a case that the first electrical parameter satisfies the first preset condition and the second electrical parameter satisfies a second preset condition, determining that no crack appears in the through silicon via;

in a case that the first electrical parameter does not satisfy the first preset condition, determining that cracks appear in a first area of the through silicon via closer to the first connection layer; or in a case that the second electrical parameter does not satisfy a second preset condition, determining that cracks appear in a second area of the through silicon via closer to the second connection layer.

13. The crack testing method according to claim 11, wherein the protection structure further comprises a conductive third test ring and a second connection layer, and the first connection layer is configured to be electrically connected to the first test ring, the second test ring, and the third test ring; and wherein the crack testing method further comprises:

providing a second electrical signal to the second contact and a third contact at an end of the third test ring, to determine a second electrical parameter of a second path arranged in the protection structure and electrically connected to the second contact and the third contact;

in a case that the first electrical parameter satisfies the first preset condition and the second electrical parameter satisfies a second preset condition, determining that no crack appears in the through silicon via;

in a case that the first electrical parameter does not satisfy the first preset condition and the second electrical parameter satisfies a second preset condition, determining that cracks appear in an area of the through silicon via close to the first connection layer between the first test ring and the second test ring; or in a case that the first electrical parameter satisfies the first preset condition and the second electrical parameter does not satisfy a second preset condition, determining that cracks appear in an area of the through silicon via close to the first connection layer between the first test ring and the second test ring.

14. The crack testing method according to claim 12, wherein each of the first electrical parameter and the second electrical parameter comprises at least one of: a resistance, a current, or a voltage difference.

* * * * *